(12) United States Patent
Motz

(10) Patent No.: US 9,853,629 B2
(45) Date of Patent: Dec. 26, 2017

(54) OSCILLATOR CIRCUIT

(71) Applicant: Infineon Technologies Austria AG, Villach (AT)

(72) Inventor: Mario Motz, Wernberg (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/831,862

(22) Filed: Aug. 20, 2015

(65) Prior Publication Data
US 2017/0117882 A1    Apr. 27, 2017

(30) Foreign Application Priority Data
Aug. 20, 2014 (DE) .................. 10 2014 111 900

(51) Int. Cl.
  H03K 3/282   (2006.01)
  H03K 3/354   (2006.01)
  H03K 3/0231  (2006.01)
  H03K 3/012   (2006.01)

(52) U.S. Cl.
  CPC ............ *H03K 3/354* (2013.01); *H03K 3/012* (2013.01); *H03K 3/0231* (2013.01); *H03K 3/2823* (2013.01)

(58) Field of Classification Search
  CPC ...... H03K 3/354; H03K 3/012; H03K 3/0231; H03K 3/2823
  USPC ...................... 331/1 R, 176, 143, 111, 113 R
  See application file for complete search history.

(56) References Cited

U.S. PATENT DOCUMENTS

| 5,319,323 A | 6/1994 | Fong |
| 5,570,067 A | 10/1996 | Shacter |
| 6,870,433 B2 | 3/2005 | Motz |
| 8,242,852 B2 * | 8/2012 | Denier .................. H03K 3/012 331/111 |

FOREIGN PATENT DOCUMENTS

| CN | 101650997 A | 2/2010 |
| CN | 103425177 A | 12/2013 |

(Continued)

OTHER PUBLICATIONS

Office Action, in the German language, from counterpart German Application No. 102014111900.2, dated Apr. 22, 2015, 5 pp.

(Continued)

*Primary Examiner* — Arnold Kinkead
(74) *Attorney, Agent, or Firm* — Shumaker & Sieffert, P.A.

(57) ABSTRACT

An oscillator circuit may include a multivibrator for generating an oscillator signal, a supply circuit having a first, second and third current path, and a current mirror for mirroring a current through the second current path into the first current path, the third current path and a current path of the multivibrator. A first transistor in the first current path is operated in weak inversion and saturation on the basis of a first gate voltage. A second transistor in the second current path may be operated in weak inversion and saturation on the basis of the first gate voltage. A third transistor in the second current path may be operated in strong inversion and in the linear region on the basis of a second gate voltage. A fourth transistor in the third current path may be operated in strong inversion and in saturation on the basis of the second gate voltage.

19 Claims, 6 Drawing Sheets

(56) References Cited

FOREIGN PATENT DOCUMENTS

| CN | 103729012 A | 4/2014 |
|---|---|---|
| JP | H06343024 A | 12/1994 |
| KR | 1020080045529 | 5/2008 |

OTHER PUBLICATIONS

Office Action, in the Korean language, from counterpart Korean Application No. 10-2015-0116876, dated Jun. 20, 7 pp.

Ni, "Low-Power CMOS Relaxation Oscillator Design with an On-Chip Circuit for Combined Temperature-Compensated Reference Voltage and Current Generation," Thesis, Northeastern University, Nov. 2013, 76 pp.

Oguey et al., "CMOS Current Reference Without Resistance," IEEE Journal of Solid-State Circuits, vol. 32, No. 7, Jul. 1997, pp. 1132-1135.

Jiaxin Liu, "Radio-Frequency Identification and Temperature Sensing Integration Label Chip Design for conforming to ISO 18000-6C Standard," Chinese Masters Theses Full-text Database Information, Science and Technology, dated Feb. 15, 2014, 12 pp. [translation of reference cited in IDS filed Oct. 24, 2017].

Jiaxin Liu, "Radio-Frequency Identification and Temperature Sensing Integration Label Chip Design for conforming to ISO 18000-6C Standard," Chinese Masters Theses Full-text Database Information, Science and Technology, dated Feb. 15, 2014, 10 pp. [translation unavailable, not provided].

Office Action, in Chinese language, from counterpart Chinese Application No. 201510628634.6, dated Oct. 10, 2017, 11 pp.

\* cited by examiner

OSCILLATOR CIRCUIT

The present application relates to an oscillator circuit and to a method for operating an oscillator circuit.

Oscillator circuits are used in diverse electronic circuits. In this regard, by way of example, an oscillator signal having a substantially rectangular signal waveform that is generated by an oscillator circuit can be used to control switching processes in a digital circuit.

For some areas of application it is desirable to use an oscillator circuit having a lower power consumption, in order thus to enable for example an efficient realization of the oscillator circuit as part of an integrated circuit. Examples of such areas of application are integrated sensor devices, integrated microprocessors or devices for controlling transitions between energy saving operation and normal operation of an electronic apparatus.

In order to enable a low power consumption of an oscillator circuit, it is known to use a multivibrator based on a band gap reference circuit, as described e.g. in U.S. Pat. No. 6,870,0433 B2. In this case, however, resistors having a high resistance in the region of 10 MΩ are required for the band gap reference circuit. An implementation of these resistors having a high resistance by means of polysilicon structures typically means a high area requirement in the resulting integrated circuit.

In "Low-power CMOS relaxation oscillator design with an on-chip circuit for combined temperature-compensated reference voltage and current generation", by Yuchi Ni, Electrical and Computer Engineering Master's Theses. Paper 127. http://hdl.handle.net/2047/d200049099 (2014), for an oscillator circuit on the basis of a band gap reference circuit and a multivibrator, it is proposed to realize a resistor having a high resistance in the band gap reference circuit by means of a MOS transistor (MOS: "Metal Oxide Semiconductor"). However, the proposed oscillator circuit requires a multiplicity of current paths in order to provide a suitable gate voltage for the MOS transistor, which in turn is associated with an increased area requirement in the integrated circuit and an increased power consumption.

It is therefore an object of the present invention to provide technologies which enable an efficient implementation of an oscillator circuit with a low power consumption.

An oscillator circuit according to claim 1, an integrated circuit according to claim 13 and a method according to claim 14 are provided in accordance with the present application. The dependent claims define further embodiments.

In accordance with one embodiment, an oscillator circuit is thus provided. The oscillator circuit comprises a multivibrator for generating an oscillator signal. The multivibrator comprises at least one current path. Furthermore, the oscillator circuit comprises a supply circuit having a first current path, a second current path and a third current path. A first field effect transistor is provided in the first current path. The first field effect transistor is configured to be operated in saturation on the basis of a first gate voltage. A second field effect transistor is provided in the second current path. The second field effect transistor is dimensioned in a manner deviating from the first field effect transistor, e.g. is provided with a greater channel width, and is likewise configured to be operated in saturation on the basis of the first gate voltage. In some embodiments, the first field effect transistor and/or the second field effect transistor are/is configured to be operated in weak inversion and saturation on the basis of the first gate voltage. Furthermore, a third field effect transistor is provided in the second current path. The third field effect transistor is configured to be operated in the linear region on the basis of a second gate voltage. A fourth field effect transistor is provided in the third current path. The fourth field effect transistor is configured to be operated in the linear region on the basis of the second gate voltage. A current mirror is provided for mirroring a current in the second current path into the first current path, the third current path and into the at least one current path of the multivibrator. A resistor having a high resistance in the region of 10 MΩ can be realized by the third field effect transistor in an efficient manner. The gate voltage of the third field effect transistor can in turn be generated via the fourth field effect transistor in an efficient manner, without this necessitating a multiplicity of additional current paths.

In accordance with one embodiment, the at least one current path of the multivibrator comprises a fourth current path for charging and/or discharging a capacitor of the multivibrator. The capacitor can be embodied on the basis of a fifth field effect transistor. The third field effect transistor and the fifth field effect transistor can be embodied at least partly by common processes. Effects of process variations can be compensated for in this way.

In accordance with one embodiment, the at least one current path of the multivibrator comprises a fifth current path for generating a reference voltage for a comparator of the multivibrator. The fifth current path can comprise a sixth field effect transistor, which is configured to be operated in strong inversion and in the linear region on the basis of the second gate voltage. The fifth field effect transistor and the sixth field effect transistor can be embodied at least partly by common processes. Effects of process variations can be compensated for in this way. The comparator can be embodied on the basis of a single field effect transistor.

In accordance with one embodiment, the oscillator circuit furthermore comprises a high-voltage depletion-mode field effect transistor. The high-voltage field effect transistor is coupled between a first supply voltage line for providing a supply voltage for the at least one current path of the multivibrator and for the first, second and third current paths of the supply circuit and a further supply voltage line. Via the high-voltage field effect transistor, a supply voltage for the various current paths can thus be derived from a further supply voltage on the further supply voltage line.

The oscillator circuit can be configured specifically for a low power consumption. In this regard, at room temperature a current consumption of the oscillator circuit can be less than 100 nA. This enables an efficient implementation as part of an integrated circuit.

In accordance with a further embodiment, a method for operating an oscillator circuit is provided. The oscillator circuit can be configured as described above.

In the method, a first field effect transistor in a first current path is operated in saturation on the basis of a first gate voltage. In a second current path, a second field effect transistor is operated in saturation on the basis of the first gate voltage. In some embodiments, the first field effect transistor and/or the second field effect transistor are/is operated in weak inversion and saturation on the basis of the first gate voltage. The second field effect transistor is dimensioned in a manner deviating from the first field effect transistor, e.g. is provided with a greater channel width. Furthermore, in the second current path, a third field effect transistor is operated in strong inversion and in the linear region on the basis of a second gate voltage. In a third current path, a fourth field effect transistor is operated in strong inversion and saturation on the basis of the second gate voltage. A current in the second current path is mirrored into the first current path, the third current path and into at least one current path of a multivibrator for generating an oscillator signal.

In accordance with one embodiment, a capacitor of the multivibrator is charged and/or discharged via the at least one current path of the multivibrator.

In accordance with one embodiment, a reference voltage for a comparator of the multivibrator is generated via the at least one current path of the multivibrator.

The field effect transistors used in the above embodiments can be formed by MOS transistors, e.g. n-channel enhancement-mode MOS transistors.

Further details of the embodiments mentioned and further embodiments are described below with reference to the accompanying drawings.

FIG. 1 schematically illustrates a multivibrator of an oscillator circuit in accordance with one exemplary embodiment of the invention.

FIG. 2 schematically illustrates a supply circuit of the oscillator circuit.

FIG. 3 schematically illustrates characteristic curve profiles of field effect transistors used in the oscillator circuit.

Exemplary embodiments of the present invention are explained in greater detail below with reference to the accompanying drawings. In this case, it goes without saying that the exemplary embodiments illustrated are intended to serve merely for elucidating implementation possibilities of the invention and should not be understood as a restriction thereof. In particular, features of different exemplary embodiments can be combined with one another. Furthermore, a description of one exemplary embodiment with a multiplicity of features should not be interpreted to the effect that all these features are necessary for implementing the invention. By way of example, other exemplary embodiments could have fewer features and/or alternative features.

Exemplary embodiments illustrated below concern an oscillator circuit. The oscillator circuit can be provided in particular for fields of application in which a low power consumption is desired. For example, the oscillator circuit can be provided for use as part of a compact integrated circuit. Such an integrated circuit can implement for example an autonomous sensor device, a device for switching between energy saving operation and normal operation of an electronic apparatus, a microprocessor or a communication apparatus. In the exemplary embodiments illustrated, the oscillator circuit is based on a multivibrator 10 which generates a rectangular oscillator signal OSC. The oscillator signal OSC can serve for example for digitally controlling switching processes in the integrated circuit. Signals used in the multivibrator are generated by means of field effect transistors operated in different regimes. These regimes differ between operation in weak inversion and operation in strong inversion. Furthermore, a distinction is drawn between operation in saturation and operation in the linear region. These modes of operation can be defined as follows for a field effect transistor: in the case of operation in weak inversion a gate voltage of the field effect transistor is below a threshold voltage of the field effect transistor, whereas in the case of operation in strong inversion the gate voltage of the field effect transistor is above the threshold voltage of the field effect transistor. In the case of operation in saturation a drain-source voltage of the field effect transistor is above a saturation voltage of the field effect transistor, wherein said saturation voltage in turn depends on the gate voltage and the threshold voltage. In the case of operation in the linear region the drain-source voltage of the field effect transistor is below the saturation voltage of the field effect transistor.

Figure 1:
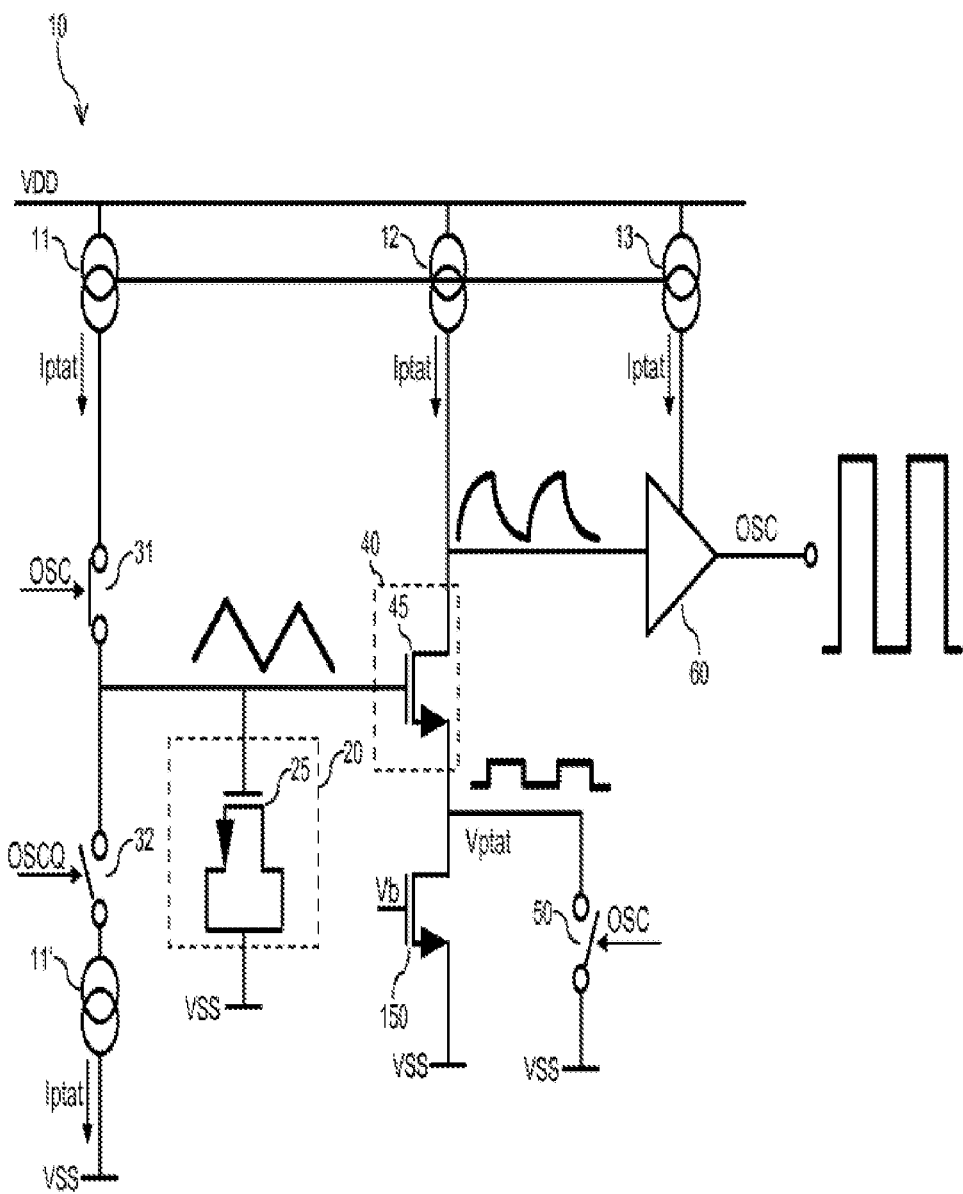

The multivibrator 10 is illustrated schematically in FIG. 1.

The multivibrator 10 illustrated in FIG. 1 is based on alternate charging and discharging of a capacitor 20. A plurality of current paths are provided for the operation of the multivibrator 10, in which current paths corresponding current sources 11, 11', 12, 13 respectively supply a current Iptat. The current paths are embodied between a first supply voltage line, which supplies a high first supply voltage VDD, and a second supply voltage line, which supplies a low second supply voltage VSS.

A current path supplied by the current source 11 has a switch 31 and serves for charging the capacitor 20. If the switch 31 is closed, the capacitor 20 is charged with the current Iptat. As illustrated, the capacitor 20 can be implemented by a MOS transistor 25 by virtue of a gate terminal of the MOS transistor 25 being used as a first terminal of the capacitor 20, while a source terminal and a drain terminal of the MOS transistor are used as a second terminal of the capacitor 20. The capacitor 20 can thus substantially be formed by a gate oxide capacitance of the MOS transistor 25.

A current path supplied by the current source 11' has a switch 32 and serves for discharging the capacitor 20. If the switch 32 is closed, the capacitor 20 is discharged by the current Iptat. The switches 31, 32 are driven in a complementary manner by the oscillator signal OSC and an inverse signal OSCQ of the oscillator signal OSC, that is to say if the switch 31 is closed, the switch 32 is open, and if the switch 31 is open, the switch 32 is closed. A triangular voltage signal is generated at the capacitor 20 as a result of the alternate charging and discharging of the capacitor 20.

A current path supplied by the current source 12 comprises a comparator 40, which brings about a comparison of the triangular voltage signal with an upper comparator threshold and a lower comparator threshold. The upper comparator threshold and the lower comparator threshold are defined by means of a reference voltage Vptat.

A current path supplied by the current source 13 serves for operating an output stage 60 of the multivibrator 10. In order to obtain a rectangular profile of the oscillator signal OSC, the output stage 60 can have a saturating amplifier characteristic. A desired amplitude of the oscillator signal OSC can also be set via the output stage 60.

As illustrated, the comparator 40 can be formed by a single MOS transistor 45 having a threshold voltage Vth, to which MOS transistor the current Iptat is fed at its drain terminal, the triangular voltage signal is fed at its gate terminal and a further voltage is fed at its source terminal, which further voltage alternates between two values in order thus to define the upper comparator threshold and the lower comparator threshold. The difference between these two values is defined by the reference voltage Vptat.

The reference voltage Vptat can be generated via a further MOS transistor 150, through which the current Iptat flows and which is operated in strong inversion and in the linear region, such that it corresponds to an ohmic resistor in terms of its effect. The MOS transistor 150 can be bridged via a switch 50 driven by means of the oscillator signal OSC. For the voltage at the source terminal of the MOS transistor 45 this results in a rectangular profile that alternates between the reference voltage Vptat and VSS at the frequency of the oscillator signal OSC.

If the capacitor 20 is charged, the switch 31 is closed. The switch 32 and the switch 50 are open. The source terminal of the MOS transistor 45 is thus at the voltage VSS+Vptat, and the MOS transistor 45 is turned on if the triangular voltage reaches the value Vss+Vptat+Vth which defines the upper comparator threshold. At this point in time a steep fall in the voltage at the drain terminal of the MOS transistor 45 arises, which leads to a falling edge in the oscillator signal OSC. As a result, the switch 31 is opened, and the switches 32 and 50 are closed. The capacitor 20 is thus subsequently discharged, and the source terminal of the MOS transistor 45 is at the voltage VSS. The MOS transistor 45 remains turned on as long as the triangular voltage is above the value VSS+Vth which defines the lower comparator threshold. If the triangular voltage reaches the value VSS+Vth, the MOS transistor 45 is turned off, which leads to a steep rise in the voltage at the drain terminal of the MOS transistor 45. This is in turn converted into a rising edge of the oscillator signal OSC.

The frequency of the oscillator signal OSC is thus defined precisely by means of the value of the current Iptat and the voltage Vptat. The current Iptat defines an edge steepness of the triangular voltage signal, while the reference voltage Vptat defines an amplitude range of the triangular voltage signal. Said amplitude range is typically in the range of less than 100 mV, e.g. approximately 50 mV.

Figure 2:
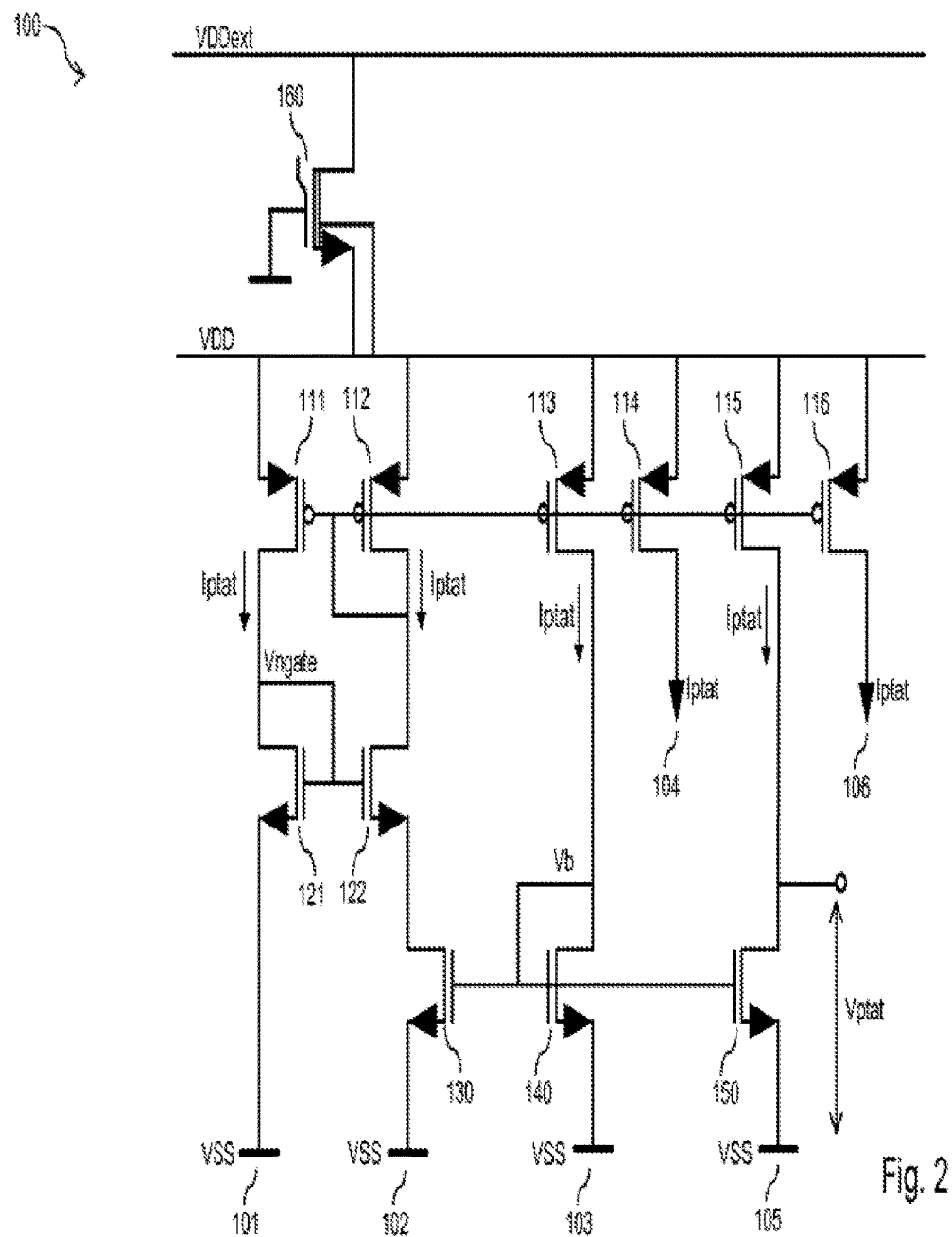

FIG. 2 schematically shows a supply circuit 100 which is used in the oscillator circuit for generating the current Iptat and the reference voltage Vptat.

As illustrated, the supply circuit 100 has a first current path 101, a second current path and a third current path 103, which are embodied between the supply voltage line for VDD and the supply voltage line for VSS. Furthermore, FIG. 2 shows current paths of the multivibrator 10 described in connection with FIG. 1, namely the current path for charging the capacitor 20, designated by 104, the current path for generating the reference voltage for the comparator 40, designated by 105, and the current path for operating the output stage 60, designated by 106.

As illustrated, in the current paths 101, 102, 103, 104, 105 in each case on the side of the supply voltage line for VDD, MOS transistors 111, 112, 113, 114, 115, 116 of the p-channel type are provided, which respectively serve as current source for the current path 101, 102, 103, 104, 105, 106. What can be achieved by the use of the same gate voltage and an identical type of construction of the MOS transistors 111, 112, 113, 114, 115, 116 is that the same current Iptat flows in each of the current paths. The gate voltage used for the MOS transistors 111, 112, 113, 114, 115, 116 is generated in the second current path 102 by the gate terminal of the MOS transistor 112 being connected to the source terminal of the MOS transistor 112. The current Iptat established in the second current path 102 is thus mirrored into the other current paths 101, 103, 104, 105, 106. The value of the current Iptat, as explained in greater detail below, is defined via further MOS transistors 121, 122, 130, 140 in the first current path 101, the second current path 102 and the third current path 103.

As illustrated, a first MOS transistor 121 of the n-channel type is provided in the first current path 101, via which MOS transistor the MOS transistor 111 is connected to VSS. The MOS transistor 121 is operated in the region of weak inversion and in saturation. This results in an exponential dependence of the current Iptat through the first MOS transistor 121 on a gate voltage Vngate of the first MOS transistor 121. For generating the gate voltage Vngate, the gate terminal of the first MOS transistor 121 is connected to the drain terminal of the first MOS transistor 121.

In the second current path 102, a second MOS transistor 122 of the n-channel type and a third MOS transistor 130 of the n-channel type are provided, which are connected in series and via which the MOS transistor 112 is connected to VSS. The second MOS transistor 122 is operated with the same gate voltage Vngate as the first MOS transistor 121 and likewise in the region of weak inversion and in saturation. This results in an exponential dependence of the current Iptat through the second MOS transistor 122 on the gate voltage Vngate. However, the second MOS transistor 122 is dimensioned in a manner deviating from the first MOS transistor. By way of example, the second MOS transistor 122 can have a greater channel width than the first MOS transistor 121. The ratio of the channel widths between the first MOS transistor 121 and the second MOS transistor 122 may be e.g. 1:8. On account of the deviating dimensioning, different current densities arise in the first MOS transistor 121 and the second MOS transistor 122.

The third MOS transistor 130 is operated in strong inversion and in the linear region and serves as a series resistor between the second MOS transistor 122 and VSS. The resistance value provided by the third MOS transistor 130 is determined by a gate voltage Vb of the third MOS transistor 130 and may be in the range of more than 1 MΩ, for example 10 MΩ.

The first current path 101 and the second current path 102 thus operate in the manner of a band gap reference circuit, wherein the current Iptat, on account of the exponential characteristic mentioned, is set to a value which, although dependent on the absolute temperature, the resistance value provided by the third MOS transistor 130 and the geometric ratio of the first MOS transistor 121 and the second MOS transistor 122, is not dependent on the supply voltage VDD or VSS. Such a current is also referred to as PTAT current (PTAT: "Proportional To Absolute Temperature").

In the third current path 103, a fourth MOS transistor 140 of the n-channel type is provided, via which the MOS transistor 113 is connected to VSS. The fourth MOS transistor 140 is operated with the same gate voltage Vb as the third MOS transistor 130 and in the region of strong inversion and in saturation. This results in a quadratic dependence of the current Iptat through the fourth MOS transistor 140 on the gate voltage Vb. On account of the saturation of the fourth MOS transistor 140, a dependence of the current Iptat through the fourth MOS transistor 140 on VDD and VSS is negligible. For generating the gate voltage Vb, the gate terminal of the fourth MOS transistor 140 is connected to the drain terminal of the fourth MOS transistor 140. What is achieved thereby in connection with the quadratic characteristic mentioned is that the gate voltage Vb is established depending on the current Iptat, wherein influences of the supply voltages VDD and VSS are negligible.

The fourth MOS transistor 140 can be dimensioned in a manner deviating from the third MOS transistor 130. By way of example, the fourth MOS transistor 140 can have a smaller channel width than the third MOS transistor 130. The ratio of the channel widths between the third MOS transistor 130 and the fourth MOS transistor 140 may be e.g.

5:4. The resistance value provided by the third MOS transistor 130 can be selected by means of this geometric ratio.

By virtue of the operation of the fourth MOS transistor 140 in strong inversion and saturation, while the current Iptat through the third current path 103 is determined by means of the exponential characteristic of the second MOS transistor 122, a stable setting of the gate voltage Vb and thus of the resistance value provided by the third MOS transistor 130 can be carried out.

Figure 3:
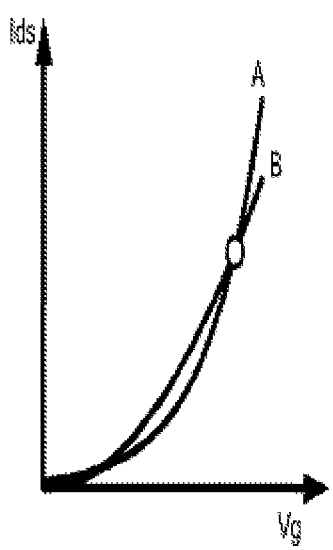

The principle of matching the exponential characteristic of the second MOS transistor 122 with the quadratic characteristic of the fourth MOS transistor 140 is illustrated in FIG. 3. In FIG. 3, the exponential profile—crucial for the second MOS transistor 122—of the drain-source current Ids as a function of the gate voltage Vg is designated by A, and the quadratic profile—crucial for the fourth MOS transistor 140—of the drain-source current Ids as a function of the gate voltage Vg is designated by B. It is evident in FIG. 3 that an unambiguously defined operating point for the gate voltages Vngate and Vb is defined by for the same current Iptat through the second MOS transistor 122 and the fourth MOS transistor 140.

The oscillator circuit illustrated can be modified with regard to the modes of operation illustrated above. In this regard, by way of example, the first MOS transistor 121 and/or the second MOS transistor 122 could be operated in moderate inversion, thus furthermore resulting in a dependence of the profile of the drain-source current which deviates from the quadratic profile in the case of the fourth MOS transistor 140 and thus enables a reliable setting of the operating point for the gate voltages Vngate and Vb.

FIG. 2 further illustrates the generation of the reference voltage Vptat by means of the MOS transistor 150 provided in the current path 105. The MOS transistor 150 is operated with the same gate voltage Vb as the third MOS transistor 130 and the fourth MOS transistor 140, in strong inversion and in the linear region. The resistance value provided by the MOS transistor 150 is determined by the gate voltage Vb and can be in the range of more than 1 MΩ, for example 10 MΩ. The MOS transistor 150 can be dimensioned in a manner deviating from the third MOS transistor 130 and/or the fourth MOS transistor 140. By way of example, the MOS transistor 150 can have a greater channel width than the fourth MOS transistor 140. The ratio of the channel widths between the MOS transistor 140 and the MOS transistor 150 can be e.g. 4:5, that is to say that the MOS transistor 150 can be dimensioned in a manner similar to the third MOS transistor 130, but in a manner deviating from the fourth MOS transistor 140. The resistance value provided by the MOS transistor 150 can be selected by means of the geometric ratio to the fourth MOS transistor 140.

As shown in FIG. 2, in some implementations a further MOS transistor 160 can be provided, which is coupled between the supply voltage line for VDD and a further supply voltage line for a further supply voltage VDDext. The MOS transistor may be, in particular, a high-voltage depletion-mode MOS transistor. By means of the MOS transistor 160, the supply voltage VDD can be derived from the further supply voltage. By way of example, the further supply voltage could be in the range of 1 V to 4 V or up to 70 V and a stabilization of the supply voltage VDD at approximately 1.4 V could be achieved by means of the MOS transistor 160. Dynamic currents in the oscillator circuit and in further circuit parts that use the oscillator signal OSC can be reduced by the MOS transistor 160. Furthermore, an improved electromagnetic compatibility can also be achieved, e.g. with regard to external interference signals coupled in via the further supply voltage line.

A current path for discharging the capacitor 20 is not illustrated in FIG. 2. It goes without saying, however, that this current path can be realized in accordance with the current path 104, wherein in this case the current Iptat is mirrored into the current path for discharging the capacitor via a current mirror, based on MOS transistors of the n-channel type, on the side of the supply voltage VSS.

For the resistance value provided by the third MOS transistor 130, in some cases there may be dependence on process variations occurring during the production of the third MOS transistor 130 and/or fourth MOS transistor 140. Such process variations can influence for example a gate oxide capacitance of the MOS transistor 130 and/or 140. In particular, the resistance value provided can decrease as a result of a higher gate oxide capacitance and the resistance value provided can increase as a result of a lower gate oxide capacitance. This would in turn result in a higher current Iptat and a higher frequency of the oscillator signal OSC, and respectively a lower current Iptat and a lower frequency of the oscillator signal OSC. However, this circumstance can be taken into account by the MOS transistor 25 of the capacitor being produced at least partly by means of the same processes as the third MOS transistor 130 and typically also the fourth MOS transistor 140. What can thus be achieved, for example, is that variations of the gate oxide capacitance of the MOS transistor 130 and/or 140 also occur in a comparable manner in the case of the MOS transistor 25 of the capacitor 20. In the latter case, however, there is an oppositely directed dependence of the frequency of the oscillator signal OSC. Specifically, in this case, a higher gate oxide capacitance of the MOS transistor 25 typically brings about a lower frequency of the oscillator signal OSC, whereas a lower gate oxide capacitance of the MOS transistor 25 typically brings about a higher frequency of the oscillator signal OSC. Production of the third MOS transistor 130 and/or of the fourth MOS transistor 140 by and also of the MOS transistor 25 by common processes can thus bring about a compensation of the effects of process variations.

For comparable reasons, the MOS transistor 150 for generating the reference voltage Vptat can also be produced at least partly by the same processes as the MOS transistor 25 of the capacitor 20. In this case, by way of example, a higher gate oxide capacitance of the transistor 150 can bring about a lower resistance value provided, a lower reference voltage Vptat and thus a higher frequency of the oscillator signal OSC. Conversely, a lower gate oxide capacitance of the transistor 150 can bring about a higher resistance value provided, a higher reference voltage Vptat and thus a lower frequency of the oscillator signal OSC. In this case, too, the effects of the process variations are thus directed oppositely to those in the case of the MOS transistor 25.

Figure 4:
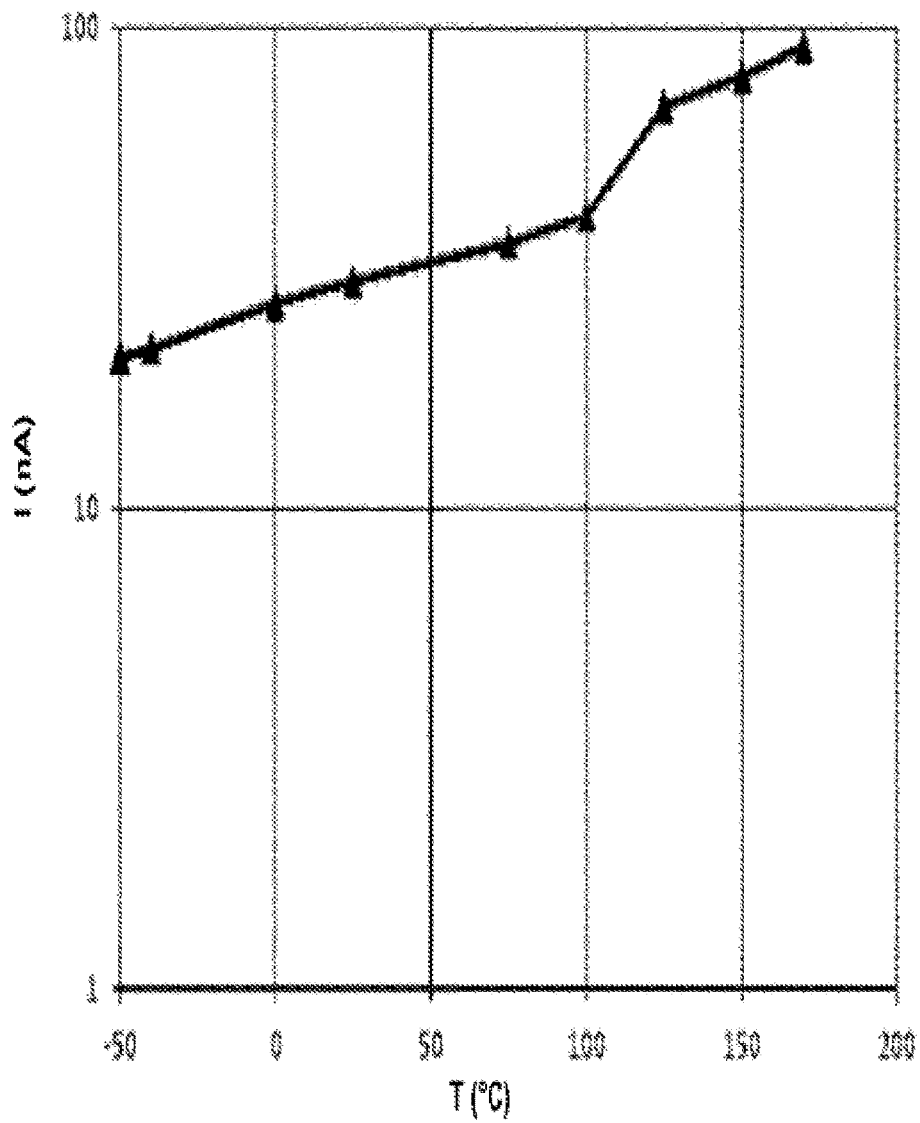
FIG. 4 shows by way of example a temperature dependence of a current consumption of an oscillator circuit in accordance with one exemplary embodiment of the invention.

FIG. 4 shows an exemplary profile of the current consumption of an oscillator circuit operating in accordance with the principles illustrated above, as a function of the temperature. In this case, a leakage current of the entire integrated circuit was excluded from measurements. It is evident that at room temperature, but also at higher temperatures, the current consumption is significantly less than 100 nA. Even at temperatures of above 150° C., a current consumption of 100 nA is not exceeded.

Figure 5:
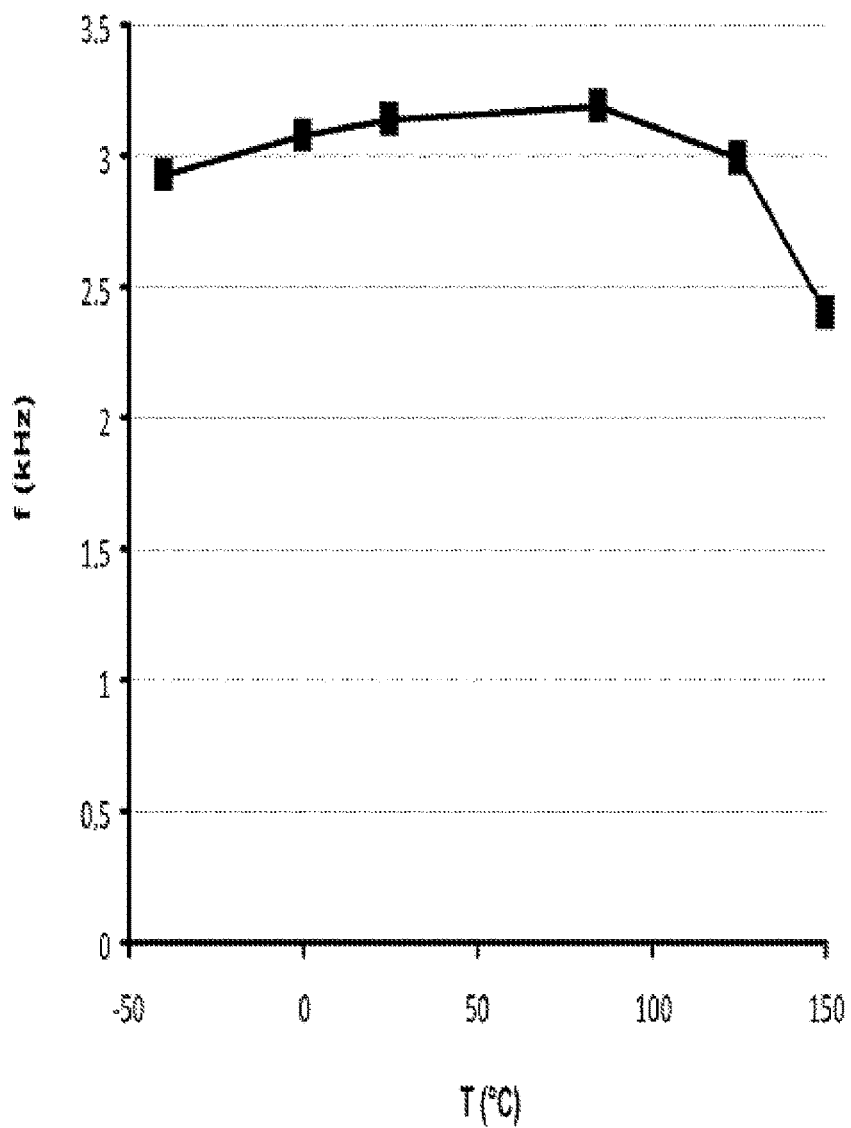
FIG. 5 shows by way of example a temperature dependence of the frequency of an oscillator signal generated by an oscillator circuit in accordance with one exemplary embodiment of the invention.

FIG. 5 shows an exemplary profile of the frequency of an oscillator signal generated by an oscillator circuit operating in accordance with the principles illustrated above, as a function of the temperature. It is evident that the frequency is stable over a wide temperature range. In order to minimize the temperature dependence, an adaptation of the saturation voltage of the first MOS transistor 121, of the second MOS transistor 122 and/or of the fourth MOS transistor 140 can also be performed.

Figure 6:
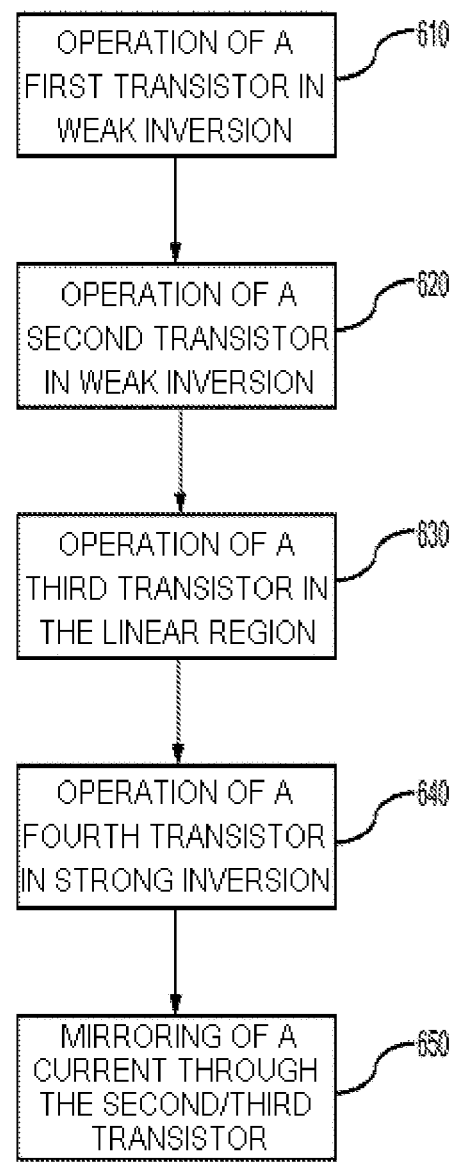
FIG. 6 shows a flow diagram for illustrating a method in accordance with one exemplary embodiment of the invention.

FIG. 6 shows a flow diagram for elucidating a method for operating an oscillator circuit, e.g. the oscillator circuit explained with reference to FIGS. 1 to 3.

In step 610 a first field effect transistor is operated in saturation on the basis of a first gate voltage. The first field effect transistor is situated in a first current path. By way of example, the first field effect transistor can be the MOS transistor 121 in the current path 101. The first field effect transistor can be operated in weak inversion and saturation in particular on the basis of the first gate voltage.

In step 620 a second field effect transistor is operated in weak inversion and in saturation on the basis of the first gate voltage. The second field effect transistor is situated in a second current path and is dimensioned in a manner deviating from the first field effect transistor. By way of example, the second field effect transistor can be the MOS transistor 122 in the current path 101. The second field effect transistor can be operated in weak inversion and saturation in particular on the basis of the first gate voltage.

In step 630 a third field effect transistor is operated in strong inversion and in the linear region on the basis of a second gate voltage. The third field effect transistor is situated in the second current path and is connected in series with the second field effect transistor. By way of example, the third field effect transistor can be the MOS transistor 130 in the current path 102.

In step 640 a fourth field effect transistor is operated in strong inversion and in saturation on the basis of the second gate voltage. The fourth field effect transistor is situated in a third current path. By way of example, the fourth field effect transistor can be the MOS transistor 140 in the current path 103.

In step 650 a current in the second current path is mirrored into the first current path, the third current path and at least one current path of a multivibrator of the oscillator circuit. By way of example, a capacitor of the multivibrator, e.g. the capacitor 20, can be charged via the at least one current path of the multivibrator. Furthermore, a reference voltage for a comparator of the multivibrator, e.g. the reference voltage Vptat, can be generated via the at least one current path of the multivibrator.

It goes without saying that in the method in FIG. 6 steps 610, 620, 630, 640, 650 do not have to be performed successively in the order illustrated. Rather, the steps can also be carried out substantially simultaneously.

Furthermore, it goes without saying that in the case of the exemplary embodiments illustrated diverse modifications are possible, without departing from the basic idea of the concepts illustrated. By way of example, the concepts illustrated could be used in connection with different types of integrated circuits. Furthermore, not only MOS transistors but also other types of field effect transistors can be used. Furthermore, it is noted that in some implementations the current Iptat need not necessarily be mirrored into the other current paths in the ratio of 1:1, rather deviating ratios can also be used. Different types of multivibrators can also be used, e.g. a multivibrator having a switchable or otherwise settable frequency of the oscillator signal generated. By way of example, the oscillator circuit described above could be switchable into a mode of operation in which the oscillator signal OSC is generated with increased frequency, e.g. if the integrated circuit that uses the oscillator signal is transferred from energy saving operation to normal operation.

The invention claimed is:

1. Oscillator circuit, comprising:
    a multivibrator for generating an oscillator signal, wherein the multivibrator comprises at least one current path;
    a supply circuit having a first current path, a second current path and a third current path;
    a current mirror for mirroring a current through the second current path into the first current path, the third current path and the at least one current path of the multivibrator;
    a first field effect transistor in the first current path, wherein the first field effect transistor is configured to be operated in saturation on the basis of a first gate voltage;
    a second field effect transistor in the second current path, which is dimensioned in a manner deviating from the first field effect transistor, wherein the second field effect transistor is configured to be operated in saturation on the basis of the first gate voltage;
    a third field effect transistor in the second current path, wherein the third field effect transistor is configured to be operated in strong inversion and in the linear region on the basis of a second gate voltage; and
    a fourth field effect transistor in the third current path, wherein the fourth field effect transistor is configured to be operated in strong inversion and in saturation on the basis of the second gate voltage.

2. Oscillator circuit according to claim 1, wherein the first field effect transistor is configured to be operated in weak inversion and saturation on the basis of the first gate voltage.

3. Oscillator circuit according to claim 1, wherein the second field effect transistor is configured to be operated in weak inversion and saturation on the basis of the first gate voltage.

4. Oscillator circuit according to claim 1 wherein the at least one current path of the multivibrator comprises a fourth current path for at least one of charging and discharging a capacitor of the multivibrator.

5. Oscillator circuit according to claim 4, wherein the capacitor is embodied on the basis of a fifth field effect transistor.

6. Oscillator circuit according to claim 5, wherein the third field effect transistor and the fifth field effect transistor are embodied at least partly by common processes.

7. Oscillator circuit according to claim 6, wherein the at least one current path of the multivibrator comprises a fifth current path for generating a reference voltage for a comparator of the multivibrator.

8. Oscillator circuit according to claim 7, wherein the fifth current path comprises a sixth field effect transistor, which is configured to be operated in the linear region on the basis of the second gate voltage.

9. Oscillator circuit according to claim 8, wherein the fifth field effect transistor and the sixth field effect transistor are embodied at least partly by common processes.

10. Oscillator circuit according to claim 8, wherein the comparator is embodied on the basis of a single field effect transistor.

11. Oscillator circuit according to claim 1, further comprising:
    a high-voltage depletion-mode field effect transistor coupled between a first supply voltage line for providing a supply voltage for the at least one current path of the multivibrator and for the first, second and third current paths of the supply circuit and a further supply voltage line.

12. Oscillator circuit according to claim 1, wherein at room temperature a current consumption of the oscillator circuit is less than 100 nA.

13. Integrated circuit comprising an oscillator circuit, wherein the oscillator circuit comprises:
- a multivibrator for generating an oscillator signal, wherein the multivibrator comprises at least one current path;
- a supply circuit having a first current path, a second current path and a third current path;
- a current mirror for mirroring a current through the second current path into the first current path, the third current path and the at least one current path of the multivibrator;
- a first field effect transistor in the first current path, wherein the first field effect transistor is configured to be operated in saturation on the basis of a first gate voltage;
- a second field effect transistor in the second current path, which is dimensioned in a manner deviating from the first field effect transistor, wherein the second field effect transistor is configured to be operated in saturation on the basis of the first gate voltage;
- a third field effect transistor in the second current path, wherein the third field effect transistor is configured to be operated in strong inversion and in the linear region on the basis of a second gate voltage; and
- a fourth field effect transistor in the third current path, wherein the fourth field effect transistor is configured to be operated in strong inversion and in saturation on the basis of the second gate voltage.

14. Method for operating an oscillator circuit, comprising:
operating a first field effect transistor in a first current path in weak inversion and saturation on the basis of a first gate voltage;
operating a second field effect transistor in the second current path in weak inversion and saturation on the basis of the first gate voltage, wherein the second field effect transistor is dimensioned in a manner deviating from the first field effect transistor;
operating a third field effect transistor in the second current path in strong inversion and in the linear region on the basis of a second gate voltage;
operating a fourth field effect transistor in a third current path in strong inversion and in saturation on the basis of the second gate voltage; and
mirroring a current in the second current path into the first current path, the third current path and into at least one current path of a multivibrator for generating an oscillator signal.

15. Method according to claim 14, wherein the first field effect transistor is a metal-oxide-semiconductor (MOS) transistor and is operated in weak inversion and saturation on the basis of the first gate voltage.

16. Method according to claim 14, wherein the second field effect transistor is a metal-oxide-semiconductor (MOS) transistor and is operated in weak inversion and saturation on the basis of the first gate voltage.

17. Method according to claim 14, comprising:
charging a capacitor of the multivibrator via the at least one current path of the multivibrator.

18. Method according to claim 14, comprising:
generating a reference voltage for a comparator of the multivibrator via the at least one current path of the multivibrator.

19. Method according to claim 14, comprising:
generating the oscillator signal, wherein the oscillator circuit comprises the multivibrator, a supply circuit having the first current path, the second current path and the third current path, a current mirror for mirroring the current through the second current path into the first current path, the third current path and the at least one current path of the multivibrator, the first field effect transistor, the second field effect transistor, the third field effect transistor, and the fourth field effect transistor.

* * * * *